(12) United States Patent
Fujita et al.

(10) Patent No.: US 7,782,657 B2
(45) Date of Patent: Aug. 24, 2010

(54) SEMICONDUCTOR DEVICE

(75) Inventors: Masashi Fujita, Tokyo (JP); Yoshiyuki Kurokawa, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 36 days.

(21) Appl. No.: 12/243,667

(22) Filed: Oct. 1, 2008

(65) Prior Publication Data

US 2009/0116278 A1    May 7, 2009

Related U.S. Application Data

(62) Division of application No. 11/494,306, filed on Jul. 27, 2006, now Pat. No. 7,443,717.

(30) Foreign Application Priority Data

Jul. 29, 2005    (JP)    ............... 2005-220887

(51) Int. Cl.
     *G11C 11/00*    (2006.01)
     *G11C 5/06*    (2006.01)
(52) U.S. Cl. ............... 365/154; 365/63; 365/72
(58) Field of Classification Search ........ 365/154, 365/155, 156
See application file for complete search history.

(56) References Cited

U.S. PATENT DOCUMENTS

| | | | |
|---|---|---|---|
| 5,018,102 A | 5/1991 | Houston | |
| 5,325,325 A | 6/1994 | Azuma | |
| 5,333,127 A | 7/1994 | Hiraki et al. | |
| RE35,591 E | * 8/1997 | Nii et al. | 365/182 |
| 5,654,914 A | * 8/1997 | Nii et al. | 365/154 |
| 5,749,090 A | 5/1998 | Feng et al. | |
| 6,128,215 A | 10/2000 | Lee | |
| 6,353,551 B1 | 3/2002 | Lee | |
| 7,069,388 B1 | 6/2006 | Greenfield et al. | |

(Continued)

FOREIGN PATENT DOCUMENTS

EP    0 344 894 A2    12/1989

(Continued)

OTHER PUBLICATIONS

European Search Report re application No. 06015506.6, dated Dec. 12, 2006. Office Action re European application No. EP 06015506.6, dated April 24, 2008.

*Primary Examiner*—Ly D Pham
(74) *Attorney, Agent, or Firm*—Husch Blackwell Sanders LLP

(57) ABSTRACT

A cache memory having valid bits, where a circuit configuration in a memory cell of a valid bit is improved so as to perform invalidation at high speed. The invention provides a cache memory including a memory cell that has a function to perform invalidation at high speed. One mode of the invention is a semiconductor device including a memory cell of a valid bit, where two inverters are connected in series to form a loop, a drain of an N-channel transistor is connected to an output signal line of one of the inverters, a gate thereof is connected to a reset signal line of a CPU, and a source thereof is connected to a ground line. The initial value of the memory cell is determined by inputting a reset signal of the CPU to the gate.

8 Claims, 11 Drawing Sheets

U.S. PATENT DOCUMENTS

| | | |
|---|---|---|
| 7,313,021 B2 * | 12/2007 | Horiuchi ................ 365/185.05 |
| 2004/0141363 A1 | 7/2004 | Ohtsuka et al. |
| 2006/0039180 A1 | 2/2006 | Kawasumi |
| 2006/0098474 A1 | 5/2006 | Dang et al. |

FOREIGN PATENT DOCUMENTS

| | | |
|---|---|---|
| EP | 0 898 281 A2 | 2/1999 |
| JP | 2005-44142 | 2/2005 |

* cited by examiner

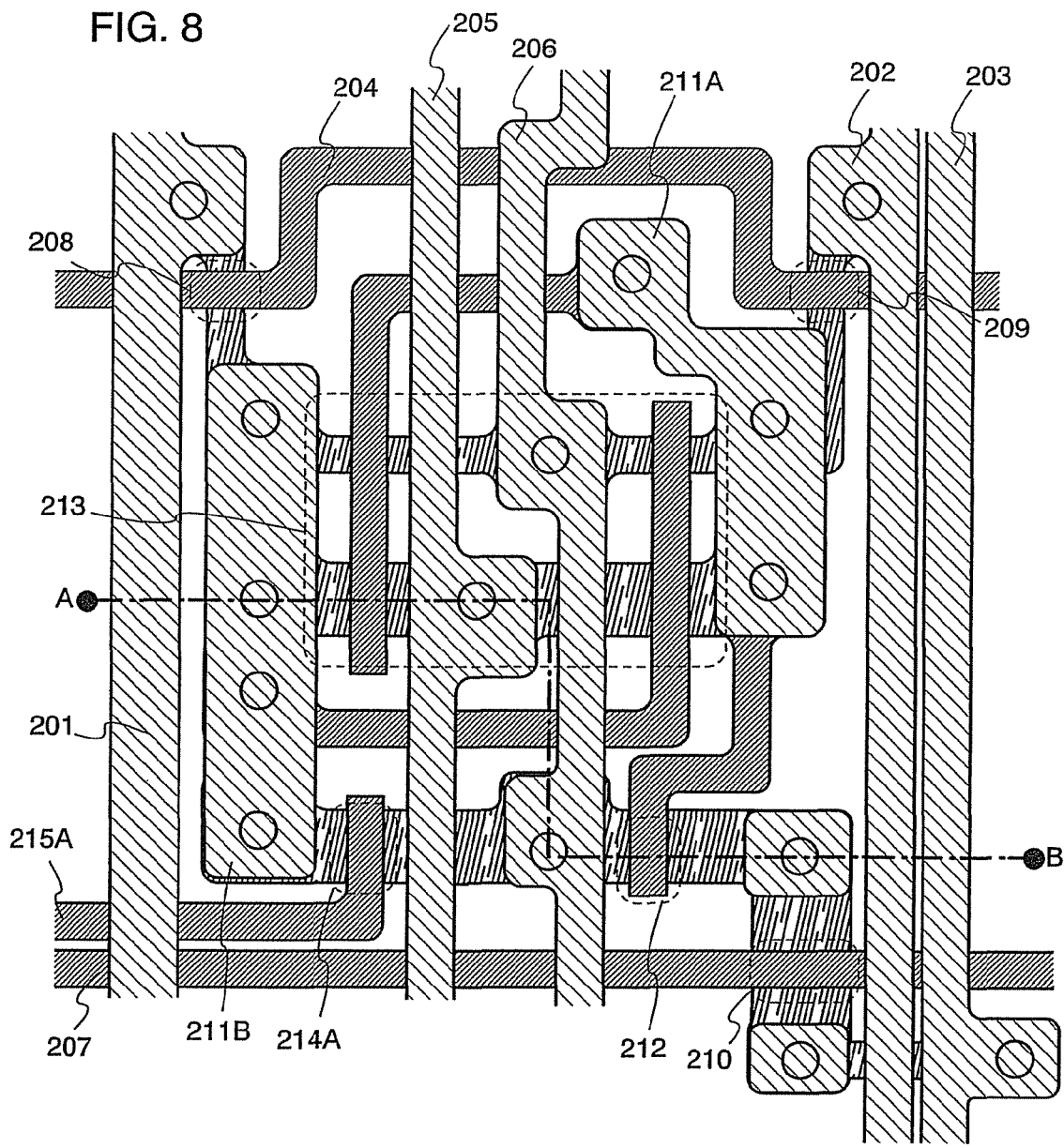

SEMICONDUCTOR DEVICE

This application is a divisional of U.S. application Ser. No. 11/494,306, filed on Jul. 27, 2006 now U.S. Pat. No. 7,443,717.

BACKGROUND OF THE INVENTION

1. Field of the Invention

The present invention relates to a memory device mounted on a semiconductor device and a semiconductor device including the memory device. Specifically, the invention relates to a cache memory device having valid bits.

2. Description of the Related Art

Almost all the current central processing units (CPUs) are based on an architecture called the stored program system. According to this stored program system, instructions processed by a CPU and data necessary for the processing are stored in a memory, and the processing of the CPU is carried out by sequentially reading data from the memory.

However, this architecture has a problem in an access speed to the memory. As storing instructions processed by the CPU and data necessary for the processing, the memory is required to have a large capacity. It is difficult, however, to use a high access speed memory having a large capacity since a high access speed memory is expensive. Accordingly, it has been suggested that a low speed memory having a large capacity (hereinafter referred to as a main memory) is used in combination with a high speed memory having a small capacity (hereinafter referred to as a cache memory).

Operation using a main memory and a cache memory is described. First, a part of the data of the main memory, which is required for processing, is read and copied into the cache memory so that a CPU has access only to the cache memory in normal processing. If the data necessary for processing is not stored in the cache memory, the data of the main memory is read and copied into the cache memory, and the CPU has access thereto. In this case, processing takes time because of the copy from the main memory to the cache memory; however, high speed operation is enabled for the second time or later since the CPU has access only to the cache memory. Note that the case where required data is stored in the cache memory is called a cache hit, while the case where required data is not stored in the cache memory is called a cache miss.

A cache memory is collections of combinations of a tag memory and a data memory (hereinafter referred to as lines), and includes a memory portion that stores a valid bit corresponding to each line. The memory portion storing a valid bit stores whether data stored in each line is valid or not. The case where invalid data is stored in a line is, for example, immediately after a power supply is turned on, in which case the valid bits of all lines are required to be invalidated. This is because the cache memory, which is generally constituted by an SRAM (Static Random Access Memory), cannot hold data when a power supply is off, and thus data stored in the cache memory cannot be specified immediately after a power supply is turned on.

However, this invalidation of valid bits takes time since it is performed for each line. Accordingly, it is necessary to put a CPU in standby mode during the invalidation.

FIG. 6 is a timing chart showing an example of the conventional invalidation of valid bits. In FIG. 6, reference numeral 300 denotes a request signal for invalidation, 303 denotes a counter signal that is to be an address in invalidation, and 302 denotes a cache access signal from a CPU. When the request signal for invalidation 300 is issued at an event timing 400, valid bits are sequentially invalidated as the address of the cache access in invalidation while sequentially counting up the counter signal 303 for each clock cycle. The invalidation is completed when the counter value reaches the total number (n) of lines to be invalidated at an event timing 401. Then, a normal cache access starts in accordance with the cache access signal 302.

An example of such a technology is disclosed in Patent Document 1. That is to say, an access of a CPU to a cache memory is determined to be a cache miss without putting the CPU in standby mode during the invalidation of valid bits, so that the CPU has access to a main memory to read required data. After the invalidation is completed, the required data is immediately stored in a cache memory, which results in high speed operation of the cache memory.

[Patent Document 1] Japanese Patent Laid-Open No. 2005-44142

When a control circuit and a buffer are added to a cache memory as disclosed in Patent Document 1, miniaturization of the cache memory is prevented. In addition, the invalidation of valid bits is carried out for each line similarly to the conventional invalidation. This may increase processing time with an increase in the capacity of the cache memory, and thus the invalidation takes time of (the number of lines in the cache memory×one cycle) at maximum. Since the time for invalidation becomes dominant with an increase in the capacity of the cache memory, it is necessary to perform the invalidation at high speed in order to significantly reduce time.

SUMMARY OF THE INVENTION

The invention provides a cache memory having valid bits, where a circuit configuration in a memory cell of a valid bit is improved so as to perform invalidation at high speed.

According to the invention, a memory cell of a cache memory has a function to operate invalidation at high speed. Specifically, a semiconductor device of the invention includes a memory cell of a valid bit where two inverters are connected in series to form a loop. In the memory cell, a drain of an N-channel transistor is connected to an output signal line of any of the inverters, a gate thereof is connected to a reset signal line of a CPU, and a source thereof is connected to a ground line. The initial value of the memory cell is determined by inputting a reset signal of the CPU to the gate.

Alternatively, a semiconductor device of the invention includes a memory cell of a valid bit where two inverters are connected in series to form a loop. In the memory cell, a drain of a P-channel transistor is connected to an output signal line of any of the inverters, a gate thereof is connected to a reset signal line of a CPU, and a source thereof is connected to a power supply line. The initial value of the memory cell is determined by inputting an inverted signal for resetting the CPU to the gate.

Alternatively, a semiconductor device of the invention includes a memory cell of a valid bit where two inverters are connected in series to form a loop. In the memory cell, a resistor, a capacitor, and the like are connected to an output signal line of any of the inverters.

Structures of the invention are specifically described below.

One mode of the invention is a semiconductor device including: an inverter circuit having a first inverter and a second inverter that hold data; a ground line connected to the first inverter and the second inverter; and one of a transistor, a resistor, and a capacitor connected to an output portion of the first inverter or an output portion of the second inverter, and the ground line.

Another mode of the invention is a semiconductor device including: an inverter circuit having a first inverter and a second inverter that hold data; a first transistor connected to an input terminal of the first inverter; a second transistor connected to an input terminal of the second inverter; a word line connected to gate electrodes of the first transistor and the second transistor; a ground line connected to the first inverter and the second inverter; and one of a third transistor, a resistor, and a capacitor connected to an output portion of the first inverter or an output portion of the second inverter, and the ground line.

Another mode of the invention is a semiconductor device including: an inverter circuit having a first inverter and a second inverter for holding a data; a power supply line connected to the first inverter and the second inverter; and a transistor connected to an output portion of the first inverter or an output portion of the second inverter, and the power supply line.

Another mode of the invention is a semiconductor device including: an inverter circuit having a first inverter and a second inverter for holding a data; a first transistor connected to an input terminal of the first inverter; a second transistor connected to an input terminal of the second inverter; a word line connected to gate electrodes of the first transistor and the second transistor; a power supply line connected to the first inverter and the second inverter; and a third transistor connected to an output portion of the first inverter or an output portion of the second inverter, and the power supply line.

Another mode of the invention is a semiconductor device including: an inverter circuit having a first inverter and a second inverter that hold data; a first transistor connected to an input terminal of the first inverter; a second transistor connected to an input terminal of the second inverter; a word line connected to gate electrodes of the first transistor and the second transistor; a power supply line connected to the first inverter and the second inverter; a ground line connected to the first inverter and the second inverter; and one of a third transistor, a resistor, and a capacitor connected to an output portion of the first inverter or an output portion of the second inverter, and the ground line.

Another mode of the invention is a semiconductor device including: an inverter circuit having a first inverter and a second inverter that hold data; a first transistor connected to an input terminal of the first inverter; a second transistor connected to an input terminal of the second inverter; a word line connected to gate electrodes of the first transistor and the second transistor; a power supply line connected to the first inverter and the second inverter; a ground line connected to the first inverter and the second inverter; and a third transistor connected to an output portion of the first inverter or an output portion of the second inverter, and the power supply line.

Another mode of the invention is a semiconductor device including: an inverter circuit having a first inverter and a second inverter that hold data; a first transistor connected to an input terminal of the first inverter; a first data line connected to the first transistor; a second transistor connected to an input terminal of the second inverter; a second data line connected to the second transistor; a word line connected to gate electrodes of the first transistor and the second transistor; a power supply line connected to the first inverter and the second inverter; a ground line connected to the first inverter and the second inverter; and one of a third transistor, a resistor, and a capacitor connected to an output portion of the first inverter or an output portion of the second inverter, and the ground line.

Another mode of the invention is a semiconductor device including: an inverter circuit having a first inverter and a second inverter that hold data; a first transistor connected to an input terminal of the first inverter; a first data line connected to the first transistor; a second transistor connected to an input terminal of the second inverter; a second data line connected to the second transistor; a word line connected to gate electrodes of the first transistor and the second transistor; a power supply line connected to the first inverter and the second inverter; a ground line connected to the first inverter and the second inverter; and a third transistor connected to an output portion of the first inverter or an output portion of the second inverter, and the power supply line.

Another mode of the invention is a semiconductor device including: an inverter circuit having a first inverter and a second inverter that hold data; a first transistor connected to an input terminal of the first inverter; a second transistor connected to an input terminal of the second inverter; a word line connected to gate electrodes of the first transistor and the second transistor; a ground line connected to the first inverter and the second inverter; one of a third transistor, a resistor, and a capacitor connected to an output portion of the first inverter and the ground line; a fourth transistor connected to the ground line, a gate electrode of which is connected to an output portion of the second inverter; a fifth transistor connected to the fourth transistor; and a data line connected to the fifth transistor.

Another mode of the invention is a semiconductor device including: an inverter circuit having a first inverter and a second inverter that hold data; a first transistor connected to an input terminal of the first inverter; a second transistor connected to an input terminal of the second inverter; a word line connected to gate electrodes of the first transistor and the second transistor; a ground line connected to the first inverter and the second inverter; one of a third transistor, a resistor, and a capacitor connected to an output portion of the second inverter and the ground line; a fourth transistor connected to the ground line, a gate electrode of which is connected to the output portion of the first inverter; a fifth transistor connected to the fourth transistor; and a data line connected to the fifth transistor.

Another mode of the invention is a semiconductor device including: an inverter circuit having a first inverter and a second inverter that hold data; a first transistor connected to an input terminal of the first inverter; a second transistor connected to an input terminal of the second inverter; a word line connected to gate electrodes of the first transistor and the second transistor; a power supply line connected to the first inverter and the second inverter; a ground line connected to the first inverter and the second inverter; one of a third transistor, a resistor, and a capacitor connected to an output portion of the first inverter and the ground line; a fourth transistor connected to the ground line, a gate electrode of which is connected to an output portion of the second inverter; a fifth transistor connected to the fourth transistor; and a data line connected to the fifth transistor.

Another mode of the invention is a semiconductor device including: an inverter circuit having a first inverter and a second inverter that hold data; a first transistor connected to an input terminal of the first inverter; a second transistor connected to an input terminal of the second inverter; a word line connected to gate electrodes of the first transistor and the second transistor; a power supply line connected to the first inverter and the second inverter; a ground line connected to the first inverter and the second inverter; one of a third transistor, a resistor, and a capacitor connected to an output portion of the second inverter and the ground line; a fourth transistor connected to the ground line, a gate electrode of which is connected to an output portion of the first inverter; a fifth transistor connected to the fourth transistor; and a data line connected to the fifth transistor.

Another mode of the invention is a semiconductor device including: an inverter circuit having a first inverter and a second inverter that hold data; a first transistor connected to an input terminal of the first inverter; a second transistor connected to an input terminal of the second inverter; a first word line connected to gate electrodes of the first transistor and the second transistor; a power supply line connected to the first inverter and the second inverter; a ground line connected to the first inverter and the second inverter; one of a third transistor, a resistor, and a capacitor connected to an output portion of the first inverter and the ground line; a fourth transistor connected to the ground line, a gate electrode of which is connected to an output portion of the second inverter; a fifth transistor connected to the fourth transistor; a second word line connected to a gate electrode of the fifth transistor; and a data line connected to the fifth transistor.

Another mode of the invention is a semiconductor device including: an inverter circuit having a first inverter and a second inverter that hold data; a first transistor connected to an input terminal of the first inverter; a second transistor connected to an input terminal of the second inverter; a first word line connected to gate electrodes of the first transistor and the second transistor; a power supply line connected to the first inverter and the second inverter; a ground line connected to the first inverter and the second inverter; one of a third transistor, a resistor, and a capacitor connected to an output portion of the second inverter and the ground line; a fourth transistor connected to the ground line, a gate electrode of which is connected to an output portion of the first inverter; a fifth transistor connected to the fourth transistor; a second word line connected to a gate electrode of the fifth transistor; and a data line connected to the fifth transistor.

Another mode of the invention is a semiconductor device including: an inverter circuit having a first inverter and a second inverter that hold data; a first transistor connected to an input terminal of the first inverter; a first data line connected to the first transistor; a second transistor connected to an input terminal of the second inverter; a second data line connected to the second transistor; a first word line connected to gate electrodes of the first transistor and the second transistor; a power supply line connected to the first inverter and the second inverter; a ground line connected to the first inverter and the second inverter; a third transistor connected to an output portion of the first inverter or an output portion of the second inverter, and the power supply line; a fourth transistor connected to the ground line, a gate electrode of which is connected to the third transistor; a fifth transistor connected to the fourth transistor; a second word line connected to a gate electrode of the fifth transistor; and a third data line connected to the fifth transistor.

Another mode of the invention is a semiconductor device including: an inverter circuit having a first inverter and a second inverter that hold data; a first transistor connected to an input terminal of the first inverter; a first data line connected to the first transistor; a second transistor connected to an input terminal of the second inverter; a second data line connected to the second transistor; a first word line connected to gate electrodes of the first transistor and the second transistor; a power supply line connected to the first inverter and the second inverter; a ground line connected to the first inverter and the second inverter; one of a third transistor, a resistor, and a capacitor connected to an output portion of the first inverter and the ground line; a fourth transistor connected to the ground line, a gate electrode of which is connected to an output portion of the second inverter; a fifth transistor connected to the fourth transistor; a second word line connected to a gate electrode of the fifth transistor; and a third data line connected to the fifth transistor.

Another mode of the invention is a semiconductor device including: an inverter circuit having a first inverter and a second inverter that hold data; a first transistor connected to an input terminal of the first inverter; a first data line connected to the first transistor; a second transistor connected to an input terminal of the second inverter; a second data line connected to the second transistor; a first word line connected to gate electrodes of the first transistor and the second transistor; a power supply line connected to the first inverter and the second inverter; a ground line connected to the first inverter and the second inverter; one of a third transistor, a resistor, and a capacitor connected to an output portion of the second inverter and the ground line; a fourth transistor connected to the ground line, a gate electrode of which is connected to an output portion of the first inverter; a fifth transistor connected to the fourth transistor; a second word line connected to a gate electrode of the fifth transistor; and a third data line connected to the fifth transistor.

According to the invention, in a cache memory having valid bits, all the valid bits can be invalidated at the same time; therefore, the invalidation of the valid bits are carried out at high speed. In other words, the time for invalidation of valid bits can be reduced, and the CPU can have access to the cache memory without being put in standby mode.

Such a memory array can be used as a cache memory of a CPU (Central Processing Unit) or an MPU (Micro Processing Unit). By applying the memory array, low power consumption of the CPU or the MPU can be achieved. Furthermore, when a reset signal is outputted in synchronism with power supply, a cache memory can be initialized quickly, leading to improvement in processing speed of the CPU. That is to say, the time for initial setting of the cache memory can be significantly reduced so that the CPU can perform the processing efficiently. As a result, a semiconductor device with excellent processing performance can be provided.

BRIEF DESCRIPTION OF DRAWINGS

FIG. 8 is a top view showing a memory cell configuration of the invention.

DETAILED DESCRIPTION OF THE INVENTION

Figure 1A:
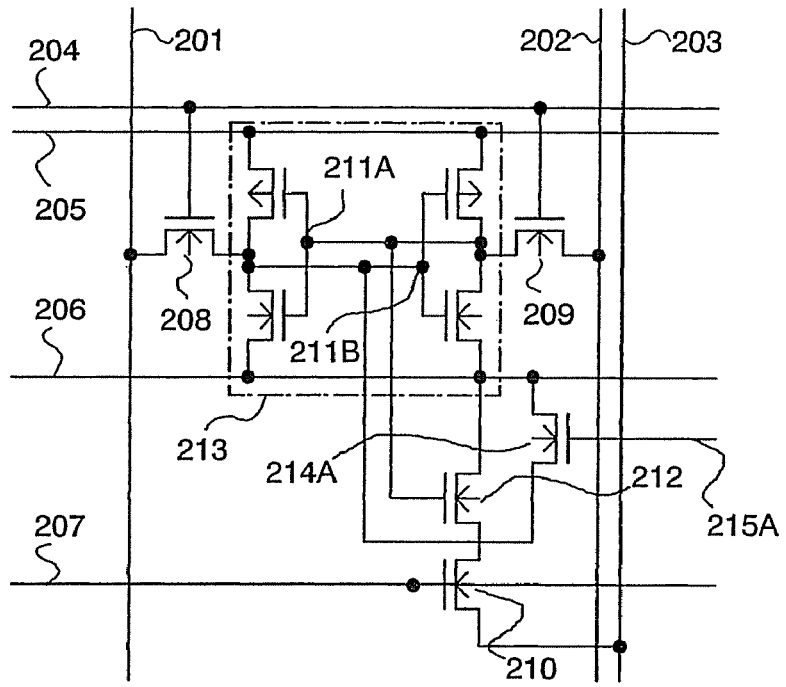
FIGS. 1A and 1B are circuit diagrams each showing a memory cell configuration of the invention.

Although the invention will be described by way of embodiment modes and embodiments with reference to the accompanying drawings, it is to be understood that various changes and modifications will be apparent to those skilled in the art. Therefore, unless such changes and modifications depart from the scope of the invention, they should be construed as being included therein. Note that in all the drawings for illustrating the embodiment modes and the embodiments, the identical portions or portions having a similar function are denoted by the same reference numerals, and description thereof is not repeated.

Embodiment Mode 1

A memory cell configuration that allows invalidation of valid bits in a cache memory to be performed at high speed is described with reference to FIGS. 1A to 3 and FIGS. 6 to 7B. Although the description is made using a power supply voltage of 5 V, the invention is not limited to this.

Figure 1B:
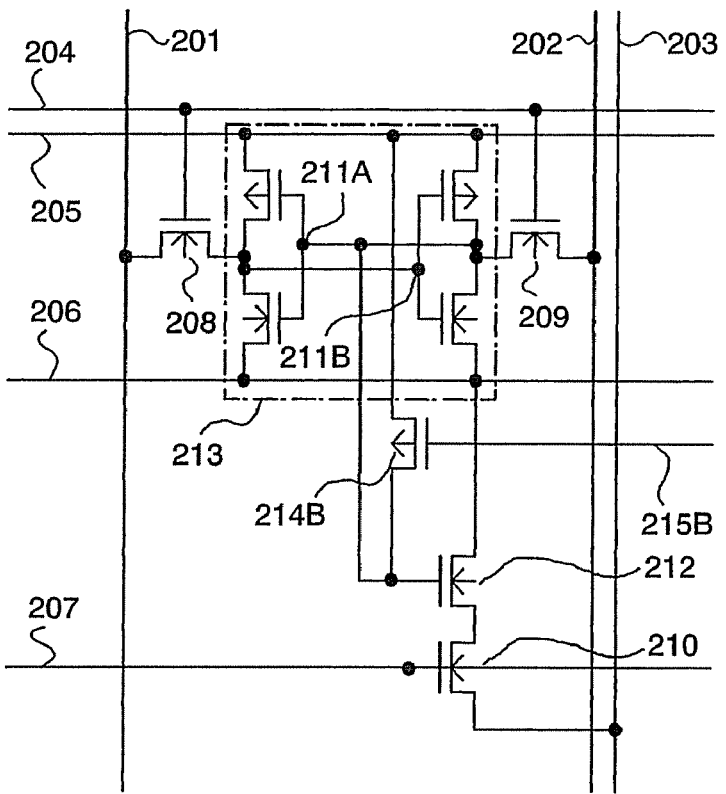

FIGS. 1A and 1B are circuit diagrams each showing a memory cell configuration of a valid bit in a cache memory according to this embodiment mode. In FIGS. 1A and 1B, a memory cell includes a power supply line 205, a ground line 206, a word line for writing 204, a word line for reading 207, a data line for writing 201, a data line for writing 202, a data line for reading 203, an N-channel transistor 208, an N-channel transistor 209, an N-channel transistor 210, an N-channel transistor 212, an N-channel transistor 214A, and an inverter circuit 213. The inverter circuit 213 includes two inverters. Writing data is inputted to the data line for writing 201, while inverted data thereof is inputted to the data line for writing 202. The data line for reading 203 is precharged to 5 V by a writing/reading circuit except in reading. The writing/reading circuit has a function to output writing data to the memory cell through the data line 201 and the data line 202 and to read data of the memory cell from the potential of the data line 203. If a plurality of memory cells of valid bits are arranged in a line, at least one writing/reading circuit is provided corresponding thereto.

The inverter circuit 213 includes two inverters, and an input terminal and an output terminal of each of the inverters are connected to each other. One electrode of each of the inverters in the inverter circuit 213 is connected to the power supply line 205, and the other electrode thereof is connected to the ground line 206. A gate electrode of the N-channel transistor 208 is connected to the word line 204, one electrode thereof is connected to the data line 201, and the other electrode thereof is connected to the output terminal of one of the inverters in the inverter circuit 213. A gate electrode of the N-channel transistor 209 is connected to the word line 204, one electrode thereof is connected to the data line 202, and the other electrode thereof is connected to the output terminal of one of the inverters in the inverter circuit 213. A gate electrode of the N-channel transistor 212 is connected to a node 211A, one electrode thereof is connected to the ground line 206, and the other electrode thereof is connected to one electrode of the N-channel transistor 210. A gate electrode of the N-channel transistor 210 is connected to the word line 207, and the other electrode thereof is connected to the data line 203. A gate electrode of the N-channel transistor 214A is connected to a wire 215A, one electrode thereof is connected to the ground line 206, and the other electrode thereof is connected to a node 211B.

In writing, the word line 204 is at 5 V and the N-channel transistor 208 and the N-channel transistor 209 are turned on, thereby data is written to the memory cell. In reading, the word line 207 is at 5 V and the N-channel transistor 210 is turned on. If the memory cell has data '0', the node 211A has a potential of 5 V (the node 211B has a potential of 0 V) and the N-channel transistor 212 is turned on. Thus, the potential of the precharged data line 203 drops to 0 V due to the N-channel transistor 210 and the N-channel transistor 212. If the memory cell has data '1', the node 211A has a potential of 0 V (the node 211B has a potential of 5 V) and the N-channel transistor 212 is not turned on. Thus, the potential of the precharged data line 203 is kept at 5 V. The data of the memory cell is held by the two inverters in the inverter circuit 213.

When a power supply is off, the inverters in the inverter circuit 213 do not operate; therefore, the potential of the node 211A cannot be specified and the memory cell cannot hold data. Even after the power supply is turned on, the potential of the node 211A can be generally specified only after any data is written to the memory cell since the potential of the node 211A is determined by several factors such as the output relation of the two inverters in the inverter circuit 213 and the wiring capacitance of the output signal lines of the two inverters.

Accordingly, in the cache memory, it is necessary to perform invalidation of valid bits first, so as to prevent a CPU from using data that cannot be specified. According to this invalidation, an access of the CPU is determined to be a cache miss, and thus the data that cannot be specified is not used. However, the invalidation of valid bits takes time since it is performed for each line.

Thus, in order to perform the invalidation of valid bits at high speed, the N-channel transistor 214A is provided between the node 211B and the ground line 206 in the memory cell of a valid bit. Here, it is assumed that each line has a 1-bit valid bit, and '1' is held when the line is valid while '0' is held when the line is invalid, if the initial value is '0'.

The gate electrode of the N-channel transistor 214A is connected to a wire 215A to which an invalidation signal is inputted to control the writing of '0' to the memory cell of a valid bit. The invalidation signal is at 5 V during a period in which invalidation of valid bits is performed. Accordingly, the N-channel transistor 214A is on during the invalidation of valid bits, and thus the potential of the node 211B drops to 0 V. As a result, the node 211A has a potential of 5 V through one of the inverters in the inverter circuit 213 and the data of the memory cell becomes '0'.

At that time, the word line 204 is prevented from being at 5 V. This is in order that the potential of the node 211B is ensured to be 0 V by the N-channel transistor 214A. The circuit configuration is specifically shown in FIG. 2, where an N-channel transistor 216 is provided between the word line 204 and the ground line 206, and a gate electrode of the N-channel transistor 216 is connected to a wire 215 to which an invalidation signal is inputted. When this circuit is added to the memory cell of a valid bit, the N-channel transistor 216 is on during the invalidation of valid bits, and thus the potential of the word line 204 drops to 0 V.

Figure 2:
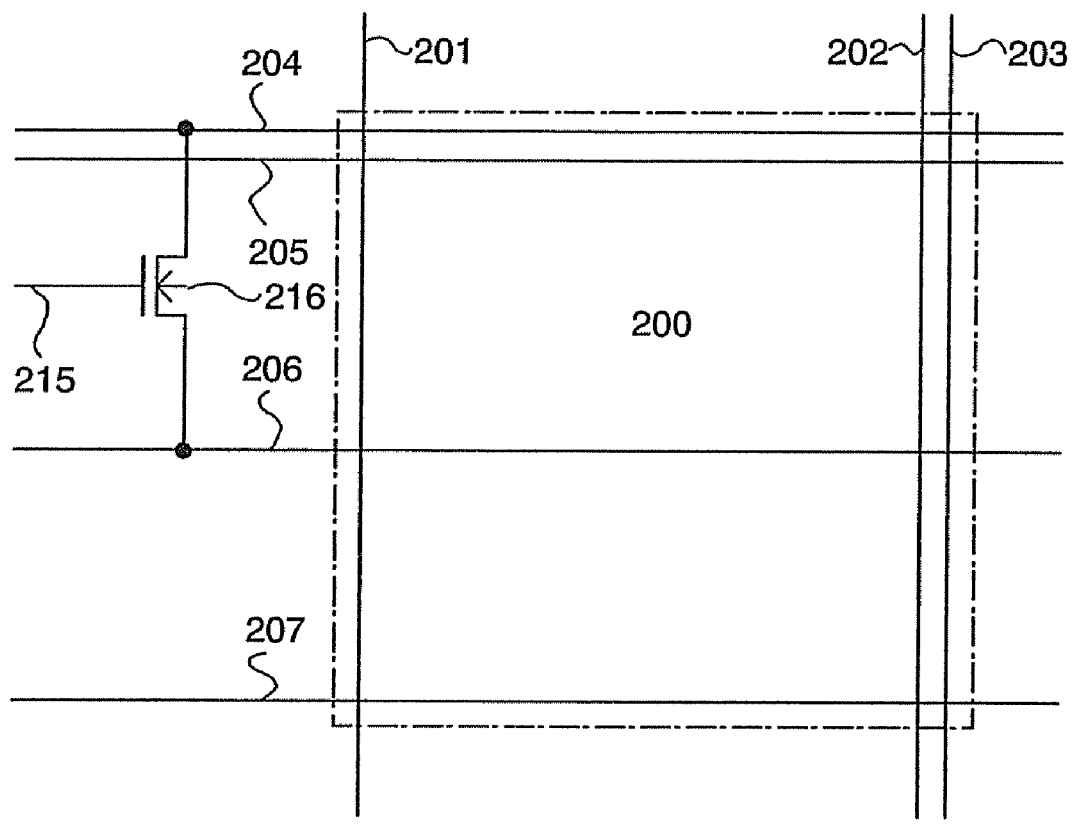
FIG. 2 is a circuit diagram showing a configuration of a line selection circuit of a cache memory of the invention.
Figure 3:
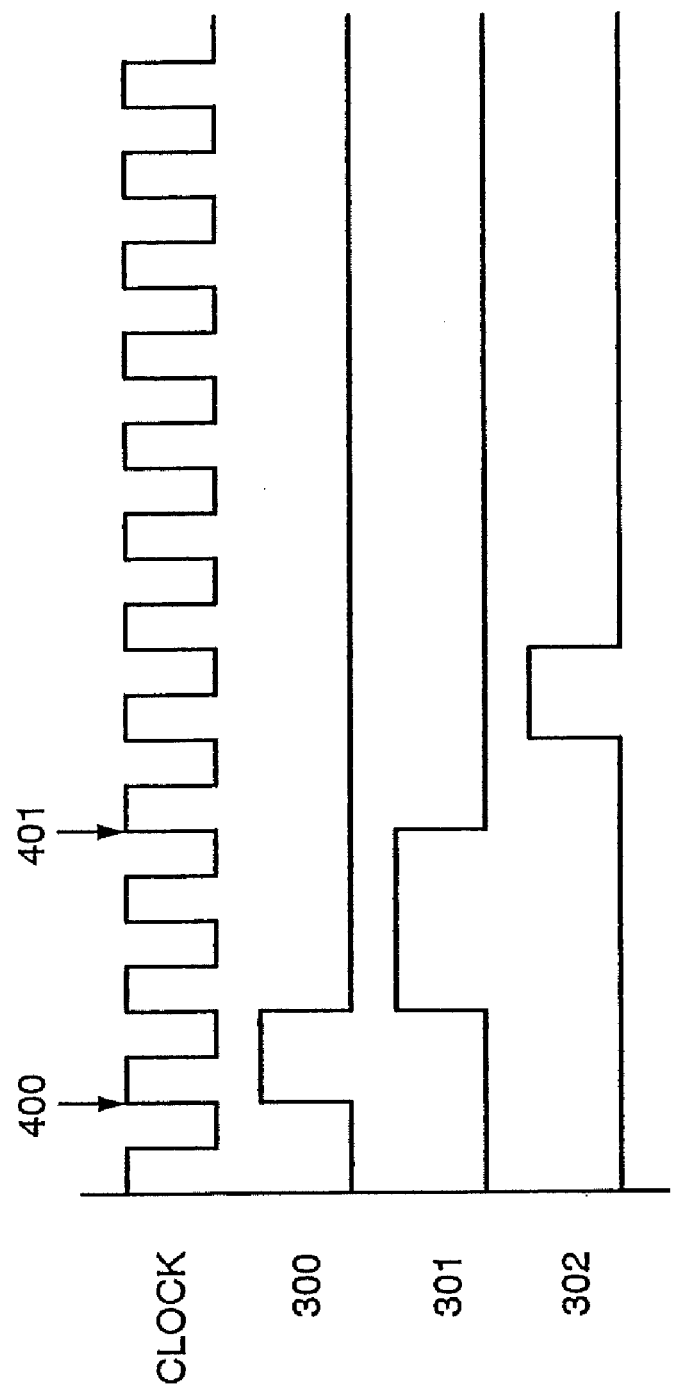
FIG. 3 is a timing chart showing an invalidation operation of the invention.

FIG. 3 is a timing chart for describing the operation in the case where the memory cell shown in FIGS. 1A and 1B is applied to valid bits of a cache memory. FIG. 3 shows a request signal for invalidation 300, an invalidation signal 301 for invalidating valid bits of each line shown in FIGS. 1A to 2, and a cache access signal 302 from a CPU. When the request signal for invalidation 300 is issued at the event timing 400, the invalidation signal 301 is issued so that all the valid bits are invalidated. The invalidation is completed at the event timing 401, then a normal cache access starts in accordance with the cache access signal 302.

When the N-channel transistor 214A is provided in memory cells of all the valid bits, all the valid bits can be invalidated at the same time. As a result, the invalidation of valid bits can be performed at high speed, and the CPU can have access to the cache memory without being put in standby mode.

Although the N-channel transistor 214A is used in FIG. 1A, a P-channel transistor 214B may also be used as shown in FIG. 1B in order to perform the invalidation of all the valid bits at the same time. At that time, as shown in FIG. 1B, the P-channel transistor 214B is provided between the node 211A and the power supply line 205, and a gate electrode of the P-channel transistor 214B is connected to a wire 215B to which an inverted signal of an invalidation signal is inputted.

As a result, the invalidation signal is at 5 V while the inverted signal thereof is at 0 V during a period in which the invalidation of valid bits is performed. Then, the P-channel transistor 214B is turned on and thus the node 211A has a potential of 5 V. Accordingly, the node 211B has a potential of 0 V through one of the inverters in the inverter circuit 213, thereby writing '0' to the memory cell of a valid bit.

Figure 7A:
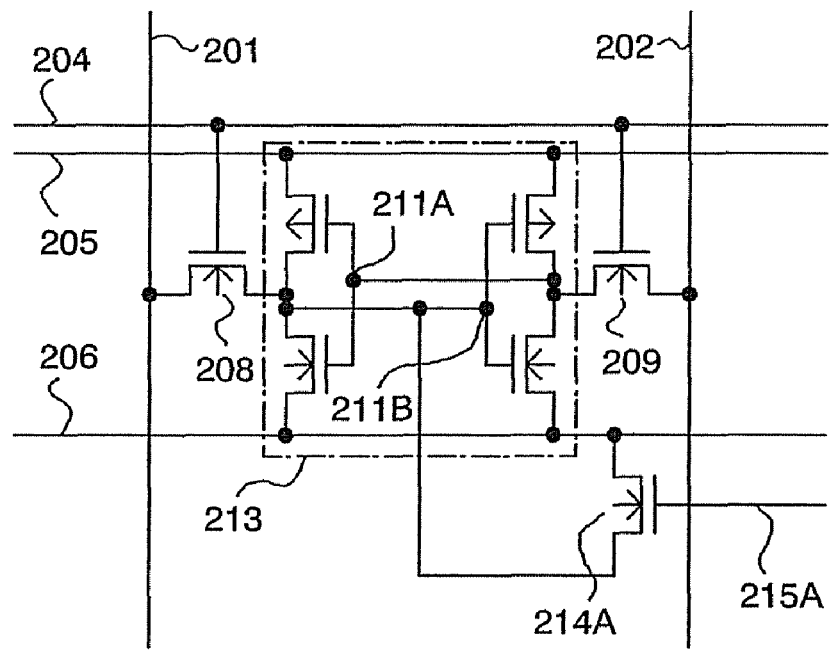
FIGS. 7A and 7B are circuit diagrams each showing a memory cell configuration of the invention.
Figure 7B:
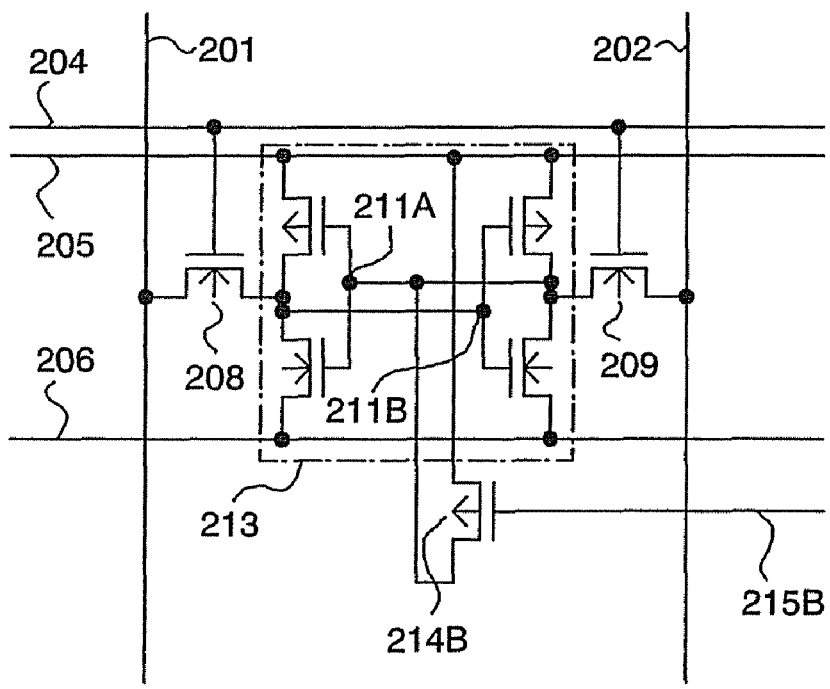

The invention can also be applied to such a memory cell of an SRAM as shown in FIGS. 7A and 7B. FIG. 7A shows a circuit diagram where the N-channel transistor 214A is provided for invalidation in a memory cell of a valid bit, and FIG. 7B shows a circuit diagram where the P-channel transistor 214B is provided for invalidation in a memory cell of a valid bit. FIGS. 7A and 7B have a structure where the data line 203, the word line 207, the N-channel transistor 210, and the N-channel transistor 212 are not provided differently from FIGS. 1A and 1B, which results in a smaller area of the memory cell than that in FIGS. 1A and 1B. As for the operation, data writing operation is performed in the same manner as in FIGS. 1A and 1B, though data reading operation is performed in different manners. Specifically, the data reading operation is performed in the following manner. First, the N-channel transistor 208 and the N-channel transistor 209 are turned on while the word line 204 is at 5 V. Then, a writing/reading circuit detects the potential of the node 211A that is inputted to the data line 202, and the potential of the node 211B that is inputted to the data line 201. If the memory cell has data '0', the data line 202 has a potential of 5 V (the data line 201 has a potential of 0 V) since the node 211A has a potential of 5 V (the node 211B has a potential of 0 V). Meanwhile, if the memory cell has data '1', the data line 202 has a potential of 0 V (the data line 201 has a potential of 5 V) since the node 211A has a potential of 0 V (the node 211B has a potential of 5 V). During the invalidation of valid bits, the N-channel transistor 214A and the P-channel transistor 214B are turned on by an invalidation signal or an inverted signal thereof, thereby the node 211A has a potential of 5 V (the node 211B has a potential of 0 V). As a result, '0' is written to the memory cell of a valid bit.

Although the above description is made of the case where the invalidation of valid bits is performed by hardware, the invalidation of valid bits may be performed by software as well. Specifically, an instruction for the invalidation of all the valid bits is provided in the instruction set of a CPU. The instruction is stored in an address to which the CPU of a main memory has access first. The configuration of a cache memory is such that it is in standby mode immediately after a power supply is turned on and the operation starts after the invalidation of valid bits. The configuration of the CPU is such that it has access to the main memory first since the cache memory is in standby mode immediately after the power supply is turned on.

Next, the operation is described. When the power supply is turned on, the CPU has access to the main memory first. At this time, the cache memory is in standby mode. The CPU reads an instruction for the invalidation of all the valid bits from the main memory. The CPU analyzes the read instruction and makes a response. The response here means the invalidation of valid bits of the cache memory, that is, the operation to write '0' to the valid bits. The aforementioned memory cell is suitable for this operation. The CPU outputs an invalidation signal to the cache memory in order to write '0' to the valid bits. The cache memory starts operation when receiving the invalidation signal, thereby performing the invalidation of valid bits. The CPU starts access to the cache memory when outputting the invalidation signal.

According to the invention, in the cache memory having valid bits, all the valid bits can be invalidated at the same time. Accordingly, the invalidation of valid bits is performed at high speed. In other words, the time for invalidation of valid bits can be reduced, and the CPU can have access to the cache memory without being put in standby mode.

Embodiment Mode 2

Figure 4A:
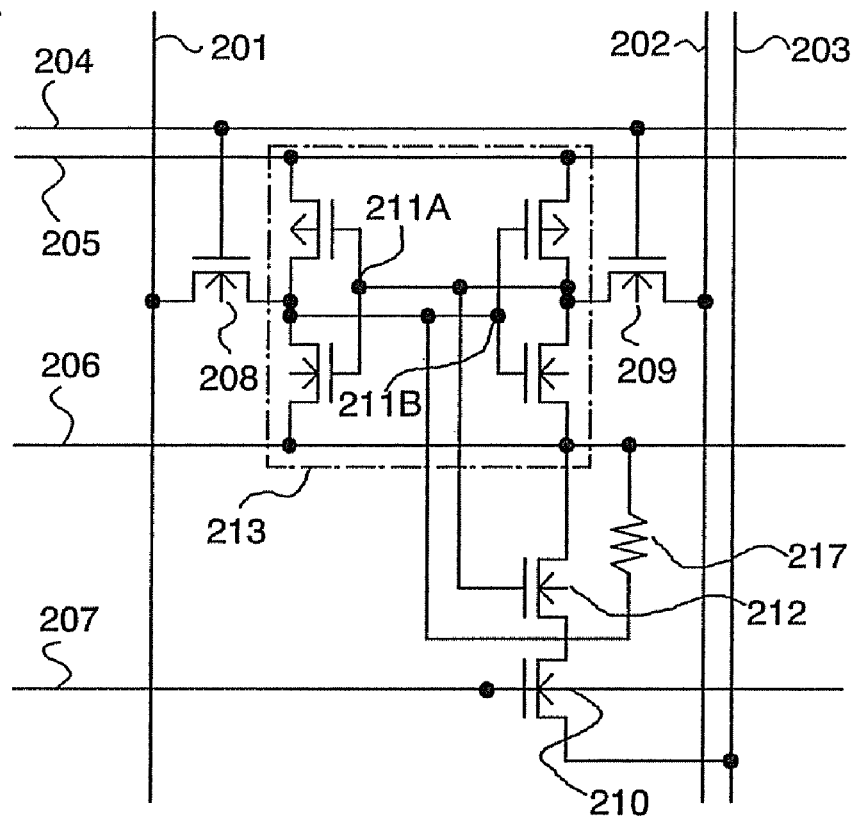
FIGS. 4A and 4B are circuit diagrams each showing a memory cell configuration of the invention.
Figure 4B:
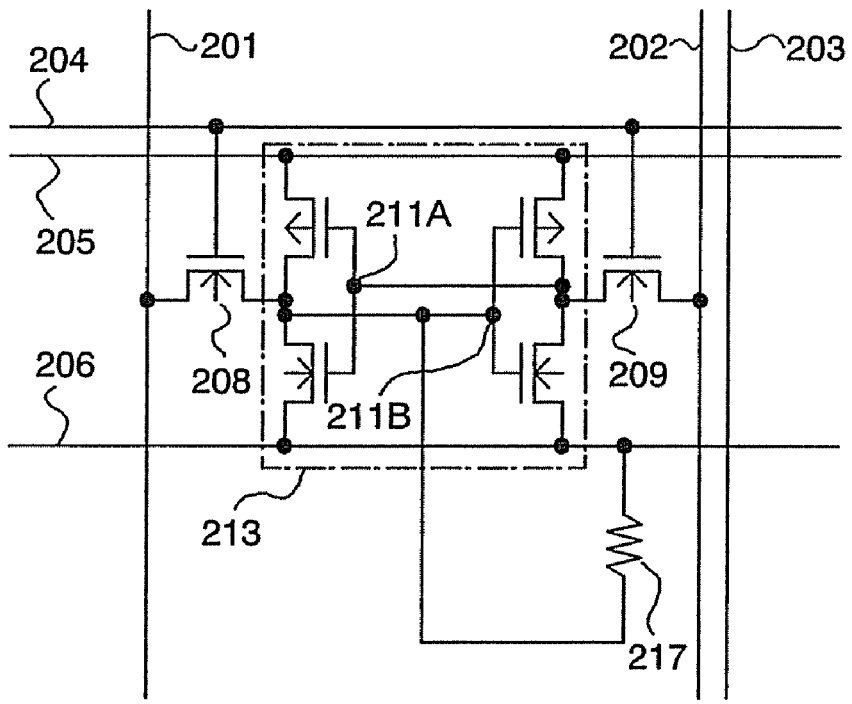

In this embodiment mode, a different mode than Embodiment Mode 1 is described with reference to FIGS. 4A and 4B. FIGS. 4A and 4B are circuit diagrams each showing a memory cell configuration of a valid bit of a cache memory according to Embodiment Mode 2 of the invention. Basically, FIG. 4A has a similar configuration to FIG. 1A and FIG. 4B has a similar configuration to FIG. 7A; however, a resistor 217 is used instead of the N-channel transistor 214A as an element for the invalidation of valid bits. The resistor 217 preferably has a resistance value of several hundreds kΩ to several MΩ.

According to the circuit configurations shown in FIGS. 4A and 4B, the potential of the node 211B is fixed to 0 V by the resistor 217 even when a power supply is off. Since the potential of the node 211B is also 0 V when the power supply is on, the memory cell of a valid bit holds '0'. This is in the same state in which the invalidation of valid bits is performed. In that case, normal writing can be performed to write data '1' to the memory cell and data can be held because of a large resistance value of the resistor 217. A large resistance value of the resistor 217 allows the minimum current to flow therethrough, and normal operation can be performed without problems.

At this time, similarly to Embodiment Mode 1, the memory cell of a valid bit can have the configuration shown in FIG. 2 so that the word line 204 is not at 5 V. That is to say, an N-channel transistor may be provided between the word line and the ground line and a gate electrode of the N-channel transistor may be connected to a wire to which an invalidation signal is inputted.

In addition, the power supply of the cache memory is divided into two systems: a power supply 1 that is supplied to the inverter circuit 213 for holding data of each valid bit; and a power supply 2 that is supplied to the other circuits. First, the power supply 2 is turned on and then the power supply 1 is turned on. Thus, when the power supply of the cache memory is turned on, the power supply 2 is turned on first, the wire 215 to which an invalidation signal is inputted becomes 5 V, and the word line 204 becomes 0 V. Then, the power supply 1 is turned on and the inverter circuit 213 of a valid bit operates. At this time, the memory cell holds data '0' since the resistor 217 controls the potential of the node 211B to 0 V in the inverter circuit 213 of a valid bit.

Although the above description is made of the case where the invalidation of valid bits is performed by hardware, the invalidation of valid bits may be performed by software as well. Specifically, an instruction for the invalidation of all the valid bits is provided in the instruction set of a CPU. The instruction is stored in an address to which the CPU of a main memory has access first. The configuration of a cache memory is such that it is in standby mode immediately after a power supply is turned on and the operation starts after the invalidation of valid bits. The standby mode means a mode where the power supply of the cache memory includes two systems, and one of them, which is for an inverter circuit in the memory cell of a valid bit is turned off. The configuration of the CPU is such that it has access to the main memory first since the cache memory is in standby mode immediately after the power supply is turned on.

Next, the operation is described. When the power supply is turned on, the CPU has access to the main memory first. At this time, the cache memory is in standby mode. The CPU reads an instruction for the invalidation of all the valid bits from the main memory. The CPU analyzes the read instruction and makes a response. The response here means the invalidation of valid bits of the cache memory, that is, the operation to turn on the power supply of the inverter circuit in the memory cell of a valid bit. The aforementioned memory cell is suitable for this operation. The cache memory starts operation when the power supply of the inverter circuit in the memory cell of a valid bit is turned on, thereby performing the invalidation of valid bits. The CPU starts access to the cache memory when the power supply of the inverter circuit in the memory cell of a valid bit is turned on.

According to the invention, in the cache memory having valid bits, all the valid bits can be invalidated at the same time. Accordingly, the invalidation of valid bits is performed at high speed. In other words, the time for invalidation of valid bits can be reduced, and the CPU can have access to the cache memory without being put in standby mode. In addition, when the resistor 217 is provided, the area of a memory cell of a valid bit can be made smaller than that in the case where the N-channel transistor 214A is provided as described in Embodiment Mode 1.

Embodiment Mode 3

Figure 5A:
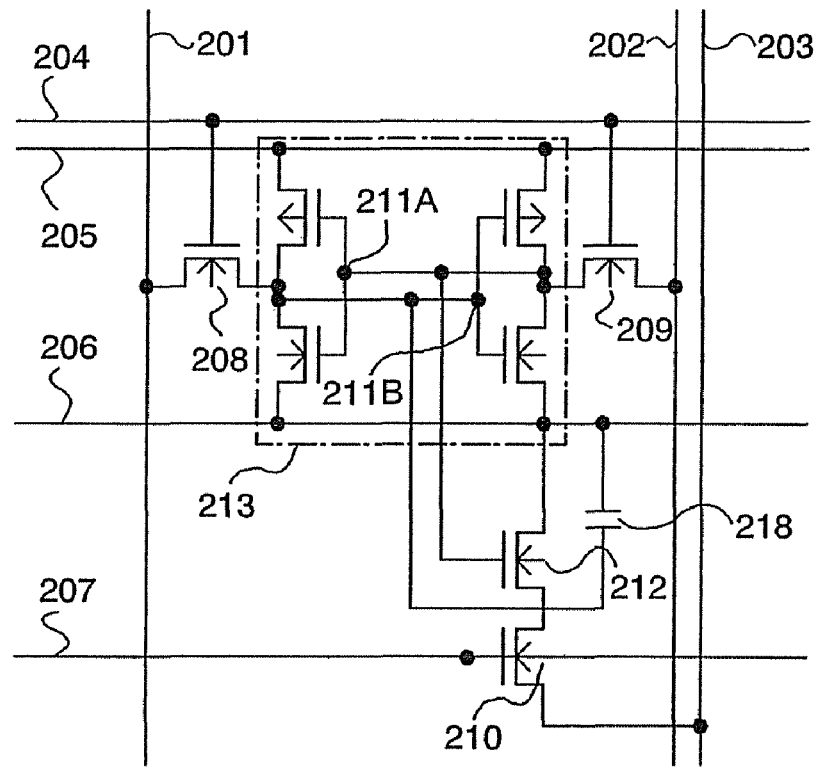
FIGS. 5A and 5B are circuit diagrams each showing a memory cell configuration of the invention.
Figure 5B:
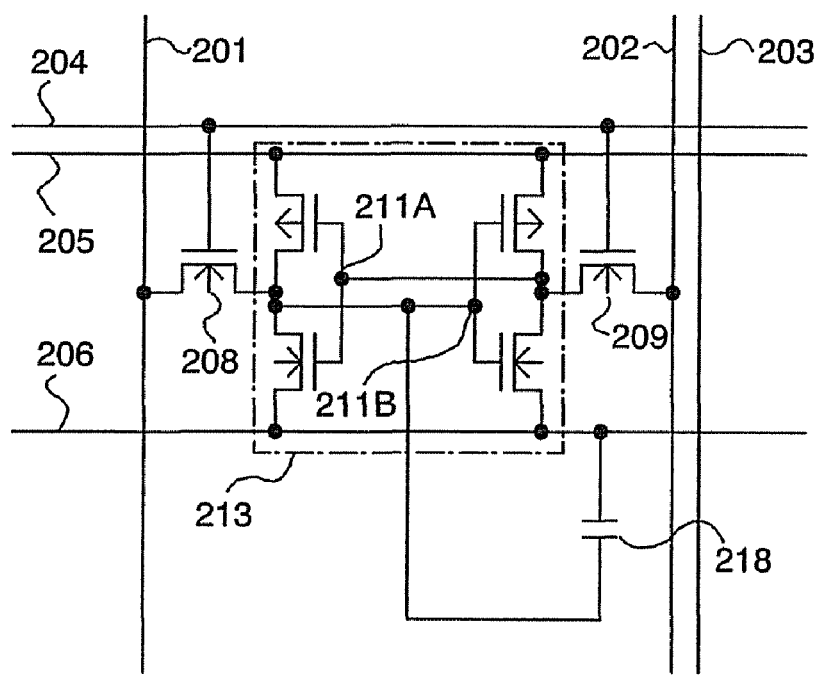
Figure 6:
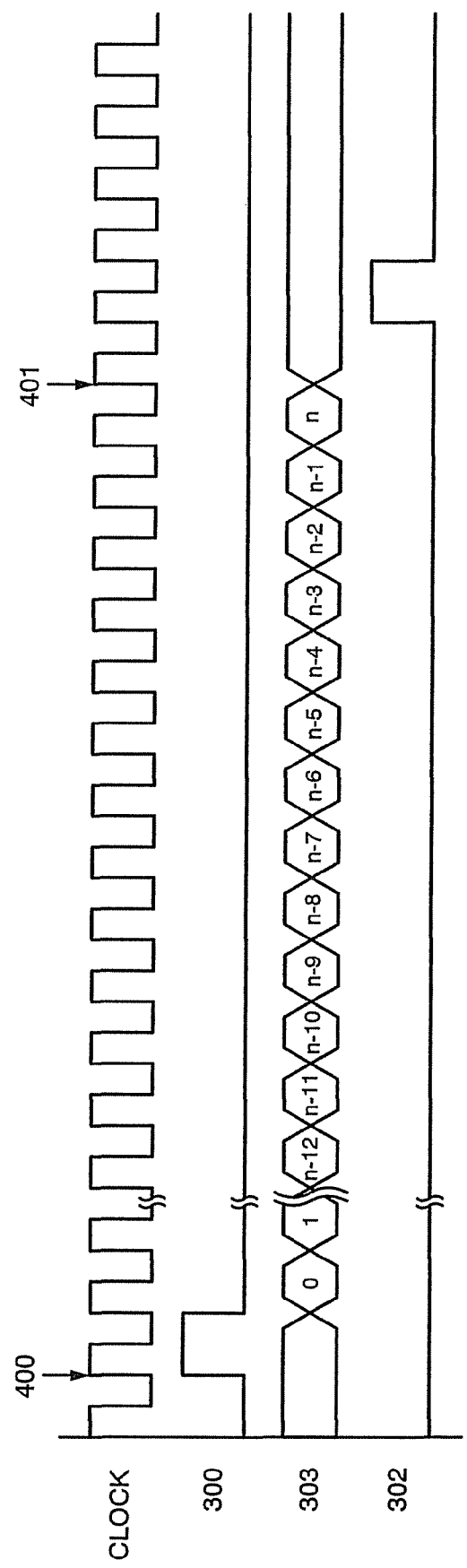
FIG. 6 is a timing chart showing an example of a conventional invalidation operation.

In this embodiment mode, a different mode than Embodiment Modes 1 and 2 is described with reference to FIGS. 5A and 5B. FIGS. 5A and 5B are circuit diagrams each showing a memory cell configuration of a valid bit of a cache memory according to Embodiment Mode 3 of the invention. Basically, FIG. 5A has a similar configuration to FIG. 1A and FIG. 5B has a similar configuration to FIG. 7A; however, a capacitor 218 is used instead of the N-channel transistor 214A as an element for the invalidation of valid bits. The capacitance of the capacitor 218 is required to be determined such that the sum of the wiring capacitance of the node 211B and the capacitance of the capacitor 218 is larger than the sum of the wiring capacitance of the node 211A and the wiring capacitance of the N-channel transistor 212 for reading, so as to upset the balance between them. However, when the sum of the wiring capacitance of the node 211B and the capacitance of the capacitor 218 is too large, writing operation cannot be performed normally; therefore, the capacitance of the capacitor 218 is required to be determined in accordance with the operating speed of a cache memory, the capacitance of the node 211A, and the like.

The potential of the node 211B is determined in accordance with the output relation of the two inverters in the inverter circuit 213 and the wiring capacitance of output signal lines of the inverters. According to the circuit configurations shown in FIGS. 5A and 5B where the capacitor 218 is additionally provided, the potential of the node 211B does not rise to 5 V easily immediately after the power supply is turned on. Thus, the potential of the node 211B is 0 V immediately after the power supply is turned on. In other words, the memory cell of a valid bit holds '0'. Note that adjustment is required so that there is not a large difference between the outputs of the inverters.

At this time, similarly to Embodiment Modes 1 and 2, the memory cell of a valid bit can have the configuration shown in FIG. 2 so that the word line 204 is not at 5 V That is to say, a gate electrode of an N-channel transistor may be connected to a wire to which an invalidation signal is inputted.

Further, similarly to Embodiment Mode 2, the power supply of the cache memory is divided into two systems: a power supply 1 that is supplied to the inverter circuit 213 for holding data of each valid bit; and a power supply 2 that is supplied to the other circuits. When power is supplied to the cache memory, the power supply 2 is turned on first, then the wire 215 to which an invalidation signal is inputted becomes 5 V and the word line 204 becomes 0 V. Then, the power supply 1 is turned on and the inverter circuit 213 in the memory cell of a valid bit operates. At this time, in the inverter circuit 213 of a valid bit, the potential of the node 211B does not rise to 5 V easily due to the capacitor 218; therefore, the memory cell holds data '0'.

Although the above description is made of the case where the invalidation of valid bits is performed by hardware, the invalidation of valid bits may be performed by software as well. Specifically, an instruction for the invalidation of all the valid bits is provided in the instruction set of a CPU. The instruction is stored in an address to which the CPU of a main memory has access first. The configuration of a cache memory is such that it is in standby mode immediately after a power supply is turned on and the operation starts after the invalidation of valid bits. The standby mode means a mode where the power supply of the cache memory includes two systems, and one of them, which is for an inverter circuit in the memory cell of a valid bit is turned off. The configuration of the CPU is such that it has access to the main memory first since the cache memory is in standby mode immediately after the power supply is turned on.

Next, the operation is described. When the power supply is turned on, the CPU has access to the main memory first. At this time, the cache memory is in standby mode. The CPU reads an instruction for the invalidation of all the valid bits from the main memory. The CPU analyzes the read instruction and makes a response. The response here means the invalidation of valid bits of the cache memory, that is, the operation to turn on the power supply of the inverter circuit in the memory cell of a valid bit. The aforementioned memory cell is suitable for this operation. The cache memory starts operation when the power supply of the inverter circuit in the memory cell of a valid bit is turned on, thereby performing the invalidation of valid bits. The CPU starts access to the cache memory when the power supply of the inverter circuit in the memory cell of a valid bit is turned on.

According to the invention, in the cache memory having valid bits, all the valid bits can be invalidated at the same time. Accordingly, the invalidation of valid bits is performed at high speed. In other words, the time for invalidation of valid bits can be reduced, and the CPU can have access to the cache memory without being put in standby mode.

Embodiment Mode 4

In this embodiment mode, structure examples of a top view and a cross sectional view of a memory cell of the invention are described with reference to FIG. 8 and FIGS. 9A to 9D respectively. Note that a thin film transistor (TFT) is used as a transistor in this embodiment mode.

FIG. 8 is a top view of a memory cell corresponding to the circuit diagram of FIG. 1A. The memory cell includes the data line for writing 201, the data line for writing 202, the data line for reading 203, the word line for writing 204, the power supply line 205, the ground line 206, the word line for reading 207, the N-channel transistor 208, the N-channel transistor 209, the N-channel transistor 210, the N-channel transistor 212, the node 211A, the node 211B, and the inverter circuit 213. The N-channel transistors 208 and 209, and the N-channel transistors 210 and 212 are formed over the same semiconductor layer. Further, an N-channel transistor and a P-channel transistor included in the inverter circuit 213 are formed over the same semiconductor layer. The N-channel transistor 210 and the N-channel transistor 212 are provided so as to have a large channel width. A transistor with a large channel width is preferably provided in order that the data line for reading 203, which has large capacitance, drops to 0 V at a predetermined operating speed. In addition, the P-channel transistor in the inverter circuit 213 is provided so as to have a larger channel width than the N-channel transistor. This is to increase the output current of the P-channel transistor.

As shown in FIG. 8, each of the semiconductor layers is patterned so as to have a rounded corner. Accordingly, each rounded corner of the semiconductor layers has a projecting portion (outside) and a depressed portion (inside). The rounded projecting portion can suppress the generation of fine powder due to abnormal discharge in dry etching using plasma. When the depressed portion is rounded, fine powder that is deposited in the corner can be removed in cleaning. As a result, significant improvement in yield can be achieved.

A gate electrode and a gate wire are provided over each of the semiconductor layers. The N-channel transistor 210 and the N-channel transistor 212 are provided in series, and a gate electrode of one of the N-channel transistors 210 and 212 functions as the ground line 206 while a gate electrode of the other functions as the word line for reading 207. Since gate electrodes of the N-channel transistor and the P-channel transistor in the inverter circuit 213 are connected to each other, they can be regarded as one gate electrode.

As shown in FIG. 8, each of the gate electrodes and the gate wires is patterned so as to have a rounded corner. Accordingly, each rounded corner of the gate electrodes and the gate wires has a projecting portion (outside) and a depressed portion (inside). The rounded projecting portion can suppress the generation of fine powder due to abnormal discharge in dry etching using plasma. When the depressed portion is rounded, fine powder that is deposited in the corner can be removed in cleaning. As a result, significant improvement in yield can be achieved.

A wire is provided over the gate electrode and the semiconductor layers. The wire is provided so as to have a larger line width than the gate electrode and the gate wire. When the line width of the wire is large, the resistance thereof can be reduced and voltage drop can be suppressed. Contact holes (portions denoted by circles in FIG. 8) are formed in an insulating layer that is provided between the wire and the semiconductor layer, the gate wire, or the like in order to connect the wire to the semiconductor layer, the gate wire, or the like. Contact failure can be reduced by increasing the number of the contact holes or increasing the area of the contact holes.

As shown in FIG. 8, the wire is patterned so as to have a rounded corner. Accordingly, the rounded corner of the wire has a projecting portion (outside) and a depressed portion (inside). The rounded projecting portion can suppress the generation of fine powder due to abnormal discharge in dry etching using plasma. When the depressed portion is rounded, fine powder that is deposited in the corner can be removed in cleaning. As a result, significant improvement in yield can be achieved.

Next, manufacturing steps of the memory cell are described with reference to cross sectional views along a line A-B of FIG. 8.

As a substrate, a substrate having insulating properties is used. The insulating substrate is a glass substrate, a quartz substrate, a plastic substrate, or the like. Such a substrate can be thinned by, for example, polishing the opposite surface thereof. Further, a substrate with a surface having insulating properties may be used by forming a base layer made of an insulating material over a conductive substrate such as a metal substrate or a semiconductor substrate such as a silicon substrate. In addition, when a flexible substrate such as a plastic substrate is used, a flexible semiconductor device that is lightweight and thin can be manufactured.

A base layer 802 is formed over an insulating substrate 801. The base layer 802 can be formed to have a single layer structure or a stacked layer structure using an insulating material such as silicon oxide, silicon nitride, and silicon oxynitride. In this embodiment mode, a two-layer structure is used for the base layer 802. As a first layer of the base layer 802, a silicon oxynitride layer with a thickness of 10 to 200 nm (preferably, 50 to 100 nm) is formed. The silicon oxynitride layer can be formed by plasma CVD using $SiH_4$, $NH_3$, $N_2O$, and $H_2$ as reaction gas. Then, as a second layer of the base layer 802, a silicon oxynitride layer with a thickness of 50 to 200 nm (preferably 100 to 150 nm) is formed. The silicon oxynitride layer can be formed by plasma CVD using $SiH_4$, $N_2O$, and the like as reaction gas.

A semiconductor layer is formed over the base layer 802. The semiconductor layer can be made of a material containing silicon. The semiconductor layer may be an amorphous, crystalline, or microcrystalline semiconductor layer. A semiconductor layer having a crystalline structure such as a single crystalline or polycrystalline structure is preferably used since the mobility of a transistor can be increased.

The semiconductor layer having a crystalline structure is formed by applying heat treatment to an amorphous semiconductor layer. The heat treatment may be performed by one or more of laser irradiation, furnace annealing, lamp irradiation, and the like.

For the laser irradiation, a continuous wave laser (CW laser) or a pulsed laser (pulse laser) can be used. A laser beam (including laser light, the same applies hereinafter) may be emitted from one or more kinds of an Ar laser, a Kr laser, an excimer laser, a YAG laser, a $Y_2O_3$ laser, a $YVO_4$ laser, a YLF laser, a $YAlO_3$ laser, a glass laser, a ruby laser, an alexandrite laser, a Ti: sapphire laser, a copper vapor laser, and a gold vapor laser. A silicon layer having a crystal with a large grain size can be obtained by being irradiated with a fundamental wave of such laser beams and harmonics of the fundamental wave such as second to fourth harmonics. As the harmonics, a second harmonic (532 nm) or a third harmonic (355 nm) of a Nd:$YVO_4$ laser (fundamental wave: 1064 nm) may be used. For the laser irradiation, an energy density of about 0.01 to 100 MW/cm$^2$ (preferably 0.1 to 10 MW/cm$^2$) is required. The scan rate is controlled to about 10 to 2000 cm/sec.

Note that the fundamental wave of a CW laser and a harmonic of a CW laser, or the fundamental wave of a CW laser and a harmonic of a pulsed laser may be used for the laser irradiation. With a plurality of laser beams, a large energy area can be irradiated.

It is also possible to use a pulsed laser beam with such a repetition rate that an amorphous silicon layer melted by a laser beam can be irradiated with the next pulsed laser beam before being solidified. By using a laser beam with such a repetition rate, a silicon layer with crystal grains that are continuously grown in the scan direction can be obtained. The repetition rate of such a laser beam is 10 MHz or higher, which is a much higher rate than that of tens to hundreds of Hz of a normally used laser beam.

When an annealing furnace is used for heat treatment, an amorphous silicon layer is heated at a temperature of 400 to 550° C. for 2 to 20 hours. At this time, the temperature is preferably set in multiple stages in the range of 400 to 550° C. so as to increase gradually. Hydrogen and the like contained in the amorphous silicon layer are exhausted in the first low temperature heating step at about 400° C., which leads to reduction in the roughness of the surface in crystallization.

In the aforementioned heat treatment, a metal for promoting the crystallization of the semiconductor layer, for example nickel (Ni) is added. When the amorphous silicon layer is coated with a solution containing nickel and subjected to the heat treatment, the heating temperature can be reduced and a polycrystalline silicon layer with a continuous crystal grain boundary can be obtained. As a metal for promoting the crystallization, nickel (Ni) as well as iron (Fe), ruthenium (Ru), rhodium (Rh), palladium (Pd), osmium (Os), iridium (Ir), platinum (Pt), copper (Cu), and the like may be employed.

Since the metal for promoting the crystallization becomes a source of pollution, a gettering step for removing the metal is desirably performed after the amorphous silicon layer is crystallized. In the gettering step, after the amorphous silicon layer is crystallized, a layer functioning as a gettering sink is formed over the silicon layer and heated, so that the metal moves to the gettering sink. As the gettering sink, a polycrystalline semiconductor layer or a semiconductor layer added with an impurity can be used. For example, a polycrystalline silicon layer added with an inert element such as argon may be formed over the silicon layer so as to be used as the gettering sink. When the inert element is added to the gettering sink, distortion occurs and the metal can be captured more efficiently. Alternatively, the metal may be captured by adding an element such as phosphorus to a part of a semiconductor layer of a transistor without forming a gettering sink.

The thus formed semiconductor layer is processed into a predetermined shape, thereby forming an island shape semiconductor layer 803. The processing is performed by etching using a mask that is formed by photolithography. As the etching, wet etching or dry etching can be used.

A gate insulating layer 804 is formed to cover the semiconductor layer 803. The gate insulating layer 804 can be formed using similar material and method to the base layer 802.

Figure 9A:
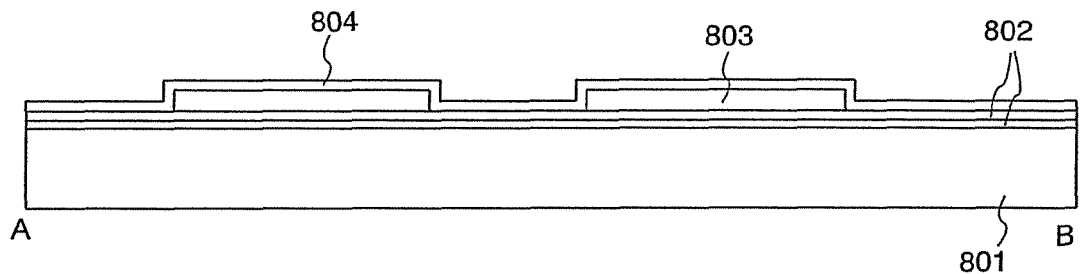
FIGS. 9A to 9D are cross sectional views each showing a memory cell configuration of the invention.
Figure 9B:
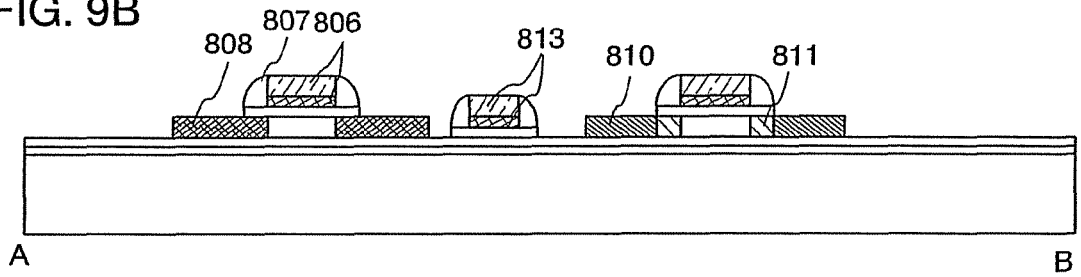

As shown in FIG. 9B, a conductive layer functioning as a gate electrode and a gate wire is formed over the gate insulating layer 804. The conductive layer can be formed using a film made of aluminum (Al), titanium (Ti), molybdenum (Mo), tantalum (Ta), tungsten (W), or silicon (Si), or an alloy film containing these elements. The conductive layer can have a single layer structure or a stacked layer structure. As the stacked layer structure, tantalum nitride and tungsten may be stacked. The conductive layer is processed into a predetermined shape, thereby forming a gate electrode 806 and a gate wire 813 each having a stacked layer structure. The processing is performed by etching using a mask that is formed by photolithography. As the etching, wet etching or dry etching can be used.

An insulating layer 807 called a sidewall is formed on a side of the gate electrode 806. The insulating layer 807 can be formed using similar material and method to the base layer 802. The end of the sidewall may be tapered by isotropic etching.

Here, an impurity element is added to the semiconductor layer 803. If an N-channel transistor is formed, phosphorus (P) may be used as the impurity element, while if a P-channel transistor is formed, boron (B) may be used as the impurity element. As a result, an impurity region is formed in the semiconductor layer 803. The impurity region includes high concentration impurity regions 808 and 810, and a low concentration impurity region 811 formed under the insulating layer 807. The low concentration impurity region 811 can prevent a short-channel effect that occurs as a gate length decreases. Since the short-channel effect is common in an N-channel transistor, the insulating layer functioning as a sidewall may be provided at least on a side of a gate electrode of the N-channel transistor. In FIGS. 9A to 9D, the low concentration impurity region is formed only in the N-channel transistor. This is because after the impurity region is formed only in the P-channel transistor, the sidewall is formed, and then the impurity region is formed in the N-channel transistor. The sidewall may also be formed in the gate wire.

After adding the impurity, heat treatment is performed as needed, so as to activate the impurity element and enhance the surface of the semiconductor layer. The heat treatment may be performed in a similar manner to the crystallization.

Figure 9C:
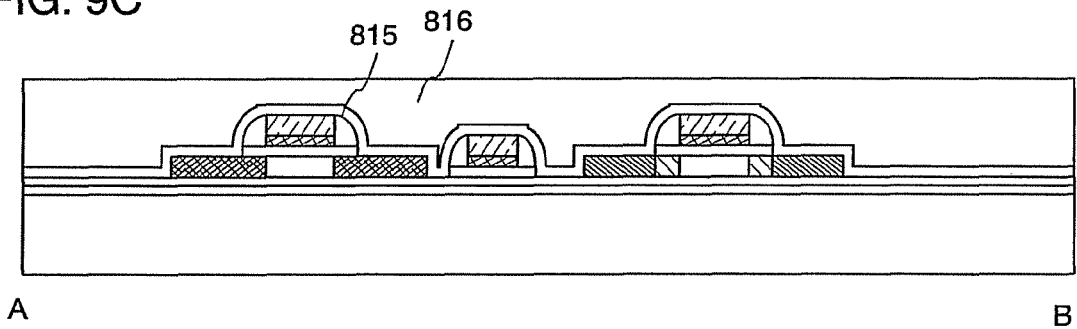

As shown in FIG. 9C, an insulating layer 815 and an insulating layer 816 functioning as an interlayer film are formed to cover the semiconductor layer and the gate electrode. The interlayer film can have a single layer structure or a stacked layer structure, and in this embodiment mode, a stacked layer structure is adopted. The interlayer film may be formed using an inorganic material or an organic material. As the inorganic material, silicon oxide, silicon nitride, silicon oxynitride, or the like can be used. As the organic material, polyimide, acrylic, polyamide, polyimideamide, resist, benzocyclobutene, siloxane, or polysilazane can be used. Note that siloxane is composed of a skeleton formed by the bond of silicon (Si) and oxygen (O), in which an organic group containing at least hydrogen (such as an alkyl group and aromatic hydrocarbon) is included as a substituent. Alternatively, a fluoro group may be used as the substituent. Further alternatively, a fluoro group and an organic group containing at least hydrogen may be used as the substituent. Polysilazane is formed of a polymer material having the bond of silicon (Si) and nitrogen (N). An inorganic material can prevent impurity elements from entering, and an organic material can increase the planarity. Therefore, in this embodiment mode, the insulating layer 815 is made of an inorganic material while the insulating layer 816 is made of an organic material.

Figure 9D:
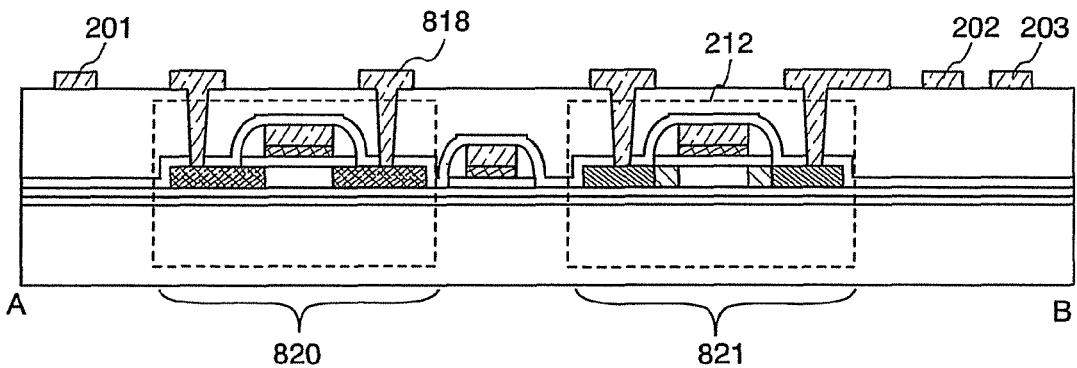

As shown in FIG. 9D, a contact hole passing through the insulating layer 816, the insulating layer 815, and the gate insulating layer 804 is formed and a wiring layer 818 is formed so as to fill the contact hole. The wiring layer 818 can be formed using a film made of aluminum (Al), titanium (Ti), molybdenum (Mo), tantalum (Ta), tungsten (W), or silicon (Si), or an alloy film containing these elements. The wiring layer 818 can have a single layer structure or a stacked layer structure. For example, a first layer made of tungsten, tungsten nitride, or the like, a second layer made of an aluminum-silicon alloy (Al—Si) or an aluminum-titanium alloy (Al—Ti), and a third layer made of titanium nitride, titanium, or the like may be stacked in this order. The wiring layer 818 may be processed by etching using a mask that is formed by photolithography. As the etching, wet etching or dry etching can be used. The wiring layer 818 is connected to the impurity region in the semiconductor layer 803. This wiring layer functions as a source electrode or a drain electrode.

In this manner, a P-channel transistor 820 and an N-channel transistor 821 can be formed. Note that the P-channel transistor 820 corresponds to one transistor constituting the inverter circuit 213, and the N-channel transistor 821 corresponds to the N-channel transistor 212.

As described above, the memory cell of the invention can be manufactured by forming transistors over a glass substrate or a plastic substrate. It is needless to say that the memory cell of the invention is not limited to this, and may be manufactured using a transistor formed over a silicon wafer. However, when a glass substrate, a plastic substrate, or the like is used, the memory cell can be manufactured at low cost. In addition, various apparatuses including the memory cell can be provided.

Embodiment Mode 5

Figure 10:
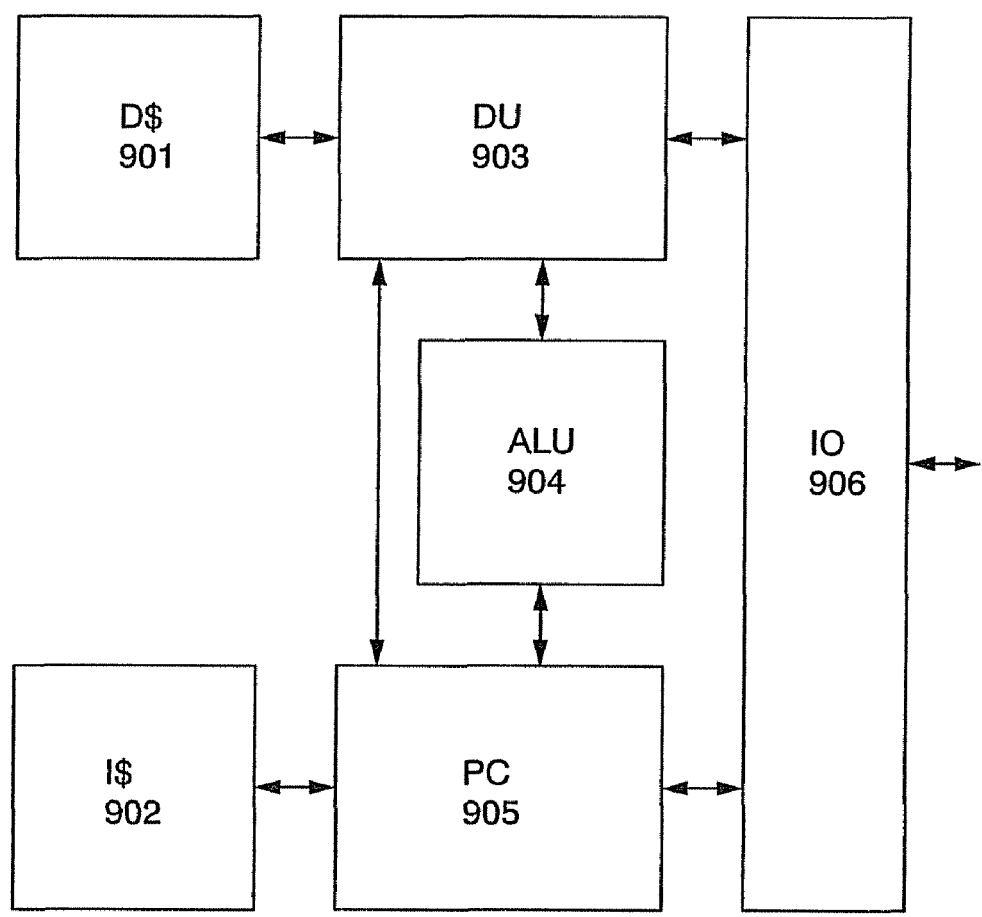
FIG. 10 is a block diagram showing a CPU on which an SRAM of the invention can be mounted.

An SRAM adopting the invention can be mounted on a CPU (Central Processing Unit). Described in this embodiment mode is a configuration of a CPU on which the SRAM of the invention is mounted. A basic configuration of the CPU is shown in FIG. 10.

A CPU includes a D$ 901 as a data cache block, an I$ 902 as an instruction cache block, a DU 903 as a data unit block, an ALU 904 as an arithmetic logic unit block, a PC 905 as a program counter block, and an IO 906 as an InOut block.

The D$ 901 has a function to temporarily store data of a recently accessed address so that the data of the address is accessed at high speed. The I$ 902 temporarily stores an instruction of a recently accessed address so that the instruction of the address can be accessed at high speed. The DU 903 determines whether the D$ 901 or the IO 906 is accessed when a load instruction or a store instruction is executed. The ALU 904 is an arithmetic logic circuit for performing four arithmetic operations, comparison operations, logical operations, and the like. The PC 905 stores the address of an instruction in execution, and fetches the next instruction after the execution. In addition, the PC 905 determines whether the I$ 902 or the IO 906 is accessed when the next instruction is fetched. The IO 906 communicates data with the outside in accordance with the access from the DU and the PC. The relation among these blocks is described below.

When the PC 905 fetches an instruction, the PC 905 has access to the I$ 902, and then to the IO 906 if the instruction of a corresponding address is not stored in the I$ 902. The instruction obtained in this manner is stored in the I$ 902 and executed. When the instruction to be executed is an arithmetic logic operation, the operation is performed by the ALU 904. When the instruction to be executed is a lord instruction or a store instruction, the operation is performed by the DU 903. In this case, the DU 903 has access to the D$ 901 first, and then to the IO 906 if the data of a corresponding address is not stored in the D$ 901.

In such a CPU, the SRAM adopting the invention can be applied to a GPR (General Purpose Register) included in the D$ 901, the I$ 902, and the ALU 904. The use of the SRAM adopting the invention allows a CPU with high processing speed to be provided.

Embodiment Mode 6

The SRAM of the invention can be mounted on various semiconductor devices such as a video camera, a digital camera, a goggle type display (head mounted display), a navigation system, an audio reproducing device (car audio system, audio component, and the like), a notebook personal computer, a game machine, a portable information terminal (mobile computer, mobile phone, portable game machine, electronic book, and the like), and an image reproducing device provided with a recording medium (specifically, a device that reproduces a recording medium such as a DVD: Digital Versatile Disc and has a display for displaying the reproduced image). Specific examples of these semiconductor devices are shown in FIGS. 11A to 11E.

Figure 11A:
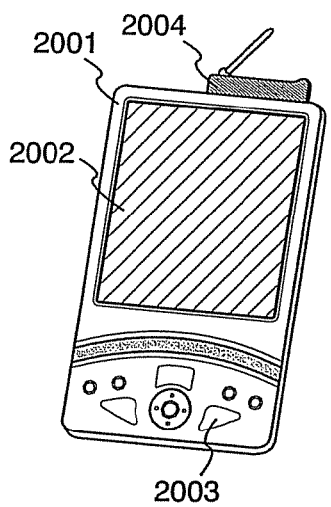
FIGS. 11A to 11E are views each showing an example of an electronic apparatus using the invention.

FIG. 11A is a portable information terminal (so-called PDA: Personal Digital Assistant) that includes a main body 2001, a display portion 2002, an operating key 2003, a modem 2004, and the like. The SRAM of the invention is used as a memory element included in the main body 2001. The SRAM of the invention allows a portable information terminal with high processing speed to be provided.

Figure 11B:
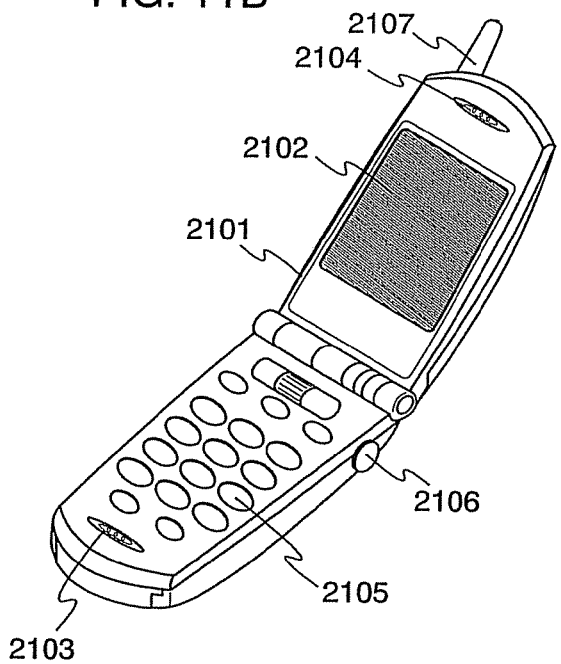

FIG. 11B is a mobile phone that includes a main body 2101, a display portion 2102, an audio input portion 2103, an audio output portion 2104, an operating key 2105, an external connecting port 2106, an antenna 2107, and the like. The SRAM of the invention is used as a memory element included in the main body 2101. The SRAM of the invention allows a mobile phone with high processing speed to be provided.

Figure 11C:
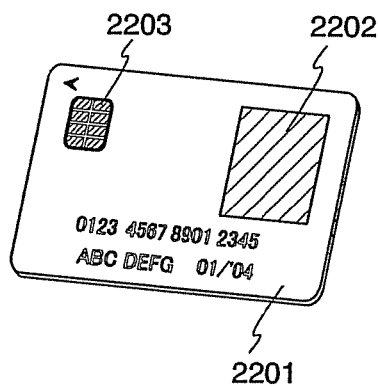

FIG. 11C is an electronic card that includes a main body 2201, a display portion 2202, a connecting terminal 2203, and the like. The SRAM of the invention is used as a memory element included in the main body 2201. The SRAM of the invention allows an electronic card with high processing speed to be provided. Note that a contact type electronic card is shown in FIG. 11C; however, the SRAM of the invention can also be applied to a contactless type electronic card or an electronic card having both functions of a contact type and a contactless type.

Figure 11D:
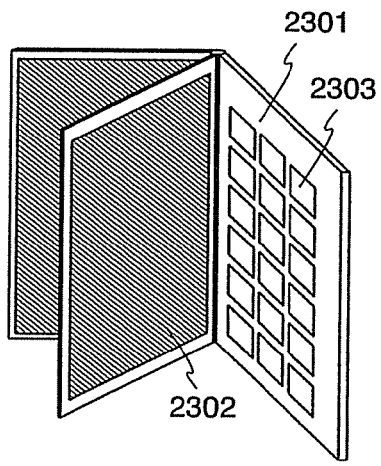

FIG. 11D is an electronic book that includes a main body 2301, a display portion 2302, an operating key 2303, and the like. The SRAM of the invention is used as a memory element included in the main body 2301. Further, a modem may be incorporated in the main body 2301 of the electronic book. The SRAM of the invention allows an electronic book with high processing speed to be provided.

Figure 11E:
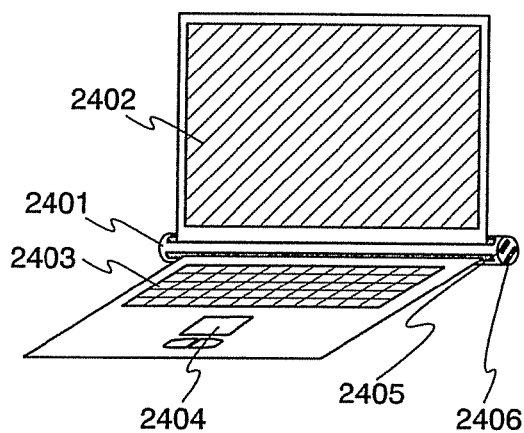

FIG. 11E is a computer that includes a main body 2401, a display portion 2402, a keyboard 2403, a touch pad 2404, an external connecting port 2405, a power plug 2406, and the like. The SRAM of the invention is used as a memory element included in the main body 2401. The SRAM of the invention allows a computer with high processing speed to be provided.

As described in this embodiment mode, the application range of the invention is so wide that the invention can be used for semiconductor devices of all fields. Note that the semiconductor devices of this embodiment mode can be implemented in combination with any of the configurations and manufacturing methods shown in other Embodiment Modes.

This application is based on Japanese Patent Application serial No. 2005-220887 filed in Japan Patent Office on Jul. 29, 2005, the entire contents of which are hereby incorporated by reference.

What is claimed is:

1. A semiconductor device comprising:
an inverter circuit including a first inverter and a second inverter for holding a data;
a first transistor connected to an input terminal of the first inverter;
a second transistor connected to an input terminal of the second inverter;
a word line connected to gate electrodes of the first transistor and the second transistor;

a power supply line connected to the first inverter and the second inverter;

a ground line connected to the first inverter and the second inverter; and a capacitor connected to the ground line and to an output portion of the first inverter or an output portion of the second inverter.

2. A semiconductor device according to claim 1, wherein the semiconductor device is at least one selected from the group consisting of a portable information terminal, a mobile phone, an electronic card, an electronic book, and a computer.

3. A semiconductor device comprising:

an inverter circuit including a first inverter and a second inverter for holding a data;

a first transistor connected to an input terminal of the first inverter;

a first data line connected to the first transistor;

a second transistor connected to an input terminal of the second inverter;

a second data line connected to the second transistor;

a word line connected to gate electrodes of the first transistor and the second transistor;

a power supply line connected to the first inverter and the second inverter;

a ground line connected to the first inverter and the second inverter; and a capacitor connected to the ground line and to an output portion of the first inverter or an output portion of the second inverter.

4. A semiconductor device according to claim 3, wherein the semiconductor device is at least one selected from the group consisting of a portable information terminal, a mobile phone, an electronic card, an electronic book, and a computer.

5. A semiconductor device comprising:

an inverter circuit including a first inverter and a second inverter for holding a data;

a first transistor connected to an input terminal of the first inverter;

a second transistor connected to an input terminal of the second inverter;

a word line connected to gate electrodes of the first transistor and the second transistor;

a ground line connected to the first inverter and the second inverter; and a capacitor connected to the ground line and to an output portion of the first inverter or an output portion of the second inverter.

6. A semiconductor device according to claim 5, wherein the semiconductor device is at least one selected from the group consisting of a portable information terminal, a mobile phone, an electronic card, an electronic book, and a computer.

7. A semiconductor device comprising:

an inverter circuit including a first inverter and a second inverter for holding a data;

a first transistor connected to an input terminal of the first inverter;

a first data line connected to the first transistor;

a second transistor connected to an input terminal of the second inverter;

a second data line connected to the second transistor;

a word line connected to gate electrodes of the first transistor and the second transistor;

a ground line connected to the first inverter and the second inverter; and a capacitor connected to the ground line and to an output portion of the first inverter or an output portion of the second inverter.

8. A semiconductor device according to claim 7, wherein the semiconductor device is at least one selected from the group consisting of a portable information terminal, a mobile phone, an electronic card, an electronic book, and a computer.

* * * * *